United States Patent
Roth-Fölsch et al.

(10) Patent No.: US 6,588,122 B2
(45) Date of Patent: Jul. 8, 2003

(54) METHOD FOR TREATING SURFACES OF SUBSTRATES AND APPARATUS

(75) Inventors: Angelika Roth-Fölsch, Alzenau (DE); Erich Arnold, Mainz (DE)

(73) Assignee: Heraeus Noblelight GmbH, Hanau (DE)

(*) Notice: Subject to any disclaimer, the term of this patent is extended or adjusted under 35 U.S.C. 154(b) by 0 days.

(21) Appl. No.: 10/134,005

(22) Filed: Apr. 26, 2002

(65) Prior Publication Data

US 2002/0112739 A1 Aug. 22, 2002

Related U.S. Application Data

(62) Division of application No. 09/709,130, filed on Nov. 8, 2000, now Pat. No. 6,409,842.

(30) Foreign Application Priority Data

Nov. 26, 1999 (DE) .......................... 199 57 034

(51) Int. Cl.$^7$ ................................. F26B 3/34
(52) U.S. Cl. ...................... 34/276; 34/275; 134/1; 134/21; 134/32
(58) Field of Search .................... 34/275, 276, 448, 34/444; 134/1, 21, 32, 33, 34

(56) References Cited

U.S. PATENT DOCUMENTS

| | | | |
|---|---|---|---|
| 4,837,484 A | | 6/1989 | Eliasson et al. ............ 313/634 |
| 4,950,624 A | * | 8/1990 | Inuzima et al. ............ 438/763 |
| 5,024,968 A | * | 6/1991 | Engelsberg ................ 438/597 |
| 5,173,638 A | | 12/1992 | Eliasson et al. ............ 313/634 |
| 5,328,517 A | * | 7/1994 | Cates et al. .................... 134/7 |
| 5,350,480 A | * | 9/1994 | Gray ........................ 156/345.26 |
| 5,482,561 A | * | 1/1996 | Yeung et al. .................. 134/1 |
| 5,879,519 A | * | 3/1999 | Seeser et al. .......... 204/192.12 |
| 6,217,665 B1 | * | 4/2001 | Suzuki ........................... 134/1 |
| 6,304,320 B1 | * | 10/2001 | Tanaka et al. ................ 355/73 |

FOREIGN PATENT DOCUMENTS

| | | |
|---|---|---|
| DE | 3 782 991 | 9/1987 |
| DE | 197 41 668 | 4/1999 |
| EP | 0260097 | 3/1985 |
| EP | 0 254 111 | 1/1988 |
| EP | 0 510 503 | 10/1992 |
| EP | 0 661 110 | 7/1995 |

\* cited by examiner

Primary Examiner—Denise L. Esquivel
Assistant Examiner—Kathryn S. OMalley
(74) Attorney, Agent, or Firm—Fulbright & Jaworski L.L.P.

(57) ABSTRACT

A method and apparatus for the treatment of surfaces of substrates of organic or inorganic materials, reactive fragments such as radicals or ions are produced by ultraviolet radiation from at least one ultraviolet radiator disposed at a given distance. The apparatus has a gas-filled, elongated discharge chamber whose walls are formed by a dielectric, and the ultraviolet radiator is provided on the side facing away from the discharge chamber with at least one electrode. During irradiation, a translational and/or rotatory relative movement is performed between the substrate and the ultraviolet radiator at a comparatively slight distance between radiator and substrate surface, in order to achieve, in a simple manner, an intense and uniform illumination of the surface being irradiated. The treatment is directed especially to silicon substrates or glass substrates.

2 Claims, 3 Drawing Sheets

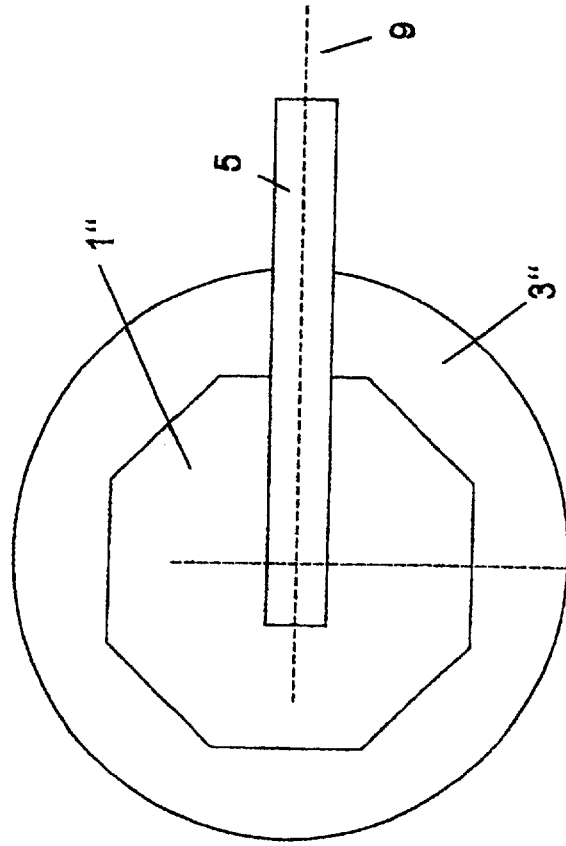
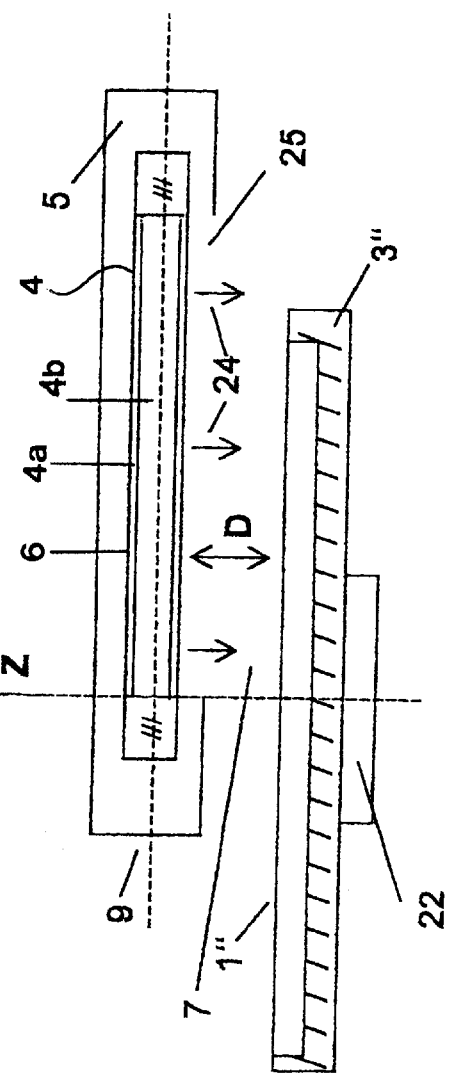

METHOD FOR TREATING SURFACES OF SUBSTRATES AND APPARATUS

This is a divisional of application No. 09/709,130 filed Nov. 8, 2000, now U.S. Pat. No. 6,409,842, issued Nov. 18, 2002.

BACKGROUND AND SUMMARY OF THE INVENTION

The invention relates to a method for treating surfaces of substrates composed of organic or inorganic materials, in which reactive fragments, especially radicals or ions, are produced, by means of ultraviolet radiation by an ultraviolet radiator disposed at a given distance away, with a gas-filled, elongated discharge chamber whose walls are formed of a dielectric, and which is provided on the side facing away from the discharge chamber with at least one electrode, as well as an apparatus.

The method relates especially to the treatment of substrates for semiconductor technology, such as silicon substrates or glass substrates for liquid crystal displays (LCD).

In EP 0 510 503 A2 a method is disclosed for cleaning or modifying surfaces of substrates which can be in the form of fibers, fleeces, fabrics or films. To clean or modify the surfaces reactive radicals are formed by irradiating gas molecules with ultraviolet light having a wavelength between 60 and 350 nm. The radicals thus formed are made to react with the surface of the substrate. To form the radicals, molecules of oxygen, ammonia, chlorine, fluorine, hydrogen chloride, hydrogen fluoride and nitrous oxide are treated with ultraviolet radiation, and a high-power ultraviolet radiator disclosed in EP 0 254 111 A1 is to be used. The high-power radiator consists of a discharge chamber defined by a metal electrode cooled on one side and a dielectric, and filled with a noble gas or gas mixture, while both the dielectric and the other electrode lying on the surface of the dielectric facing away from the discharge chamber are transparent to the radiation produced by silent electric discharges. In this manner a large-area ultraviolet radiator of high efficiency is created, which can be operated at high electric power densities of up to 50 kW/m² of active electrode surface.

Furthermore, DE 197 41 668 A1 discloses a discharge lamp with a tubular lamp of dielectric material defining a discharge chamber on whose surface facing away from the discharge chamber at least one electrode pair electrically insulated from one another by an insulating material is making surface-to-surface contact. The lamp tube is surrounded by an envelope tube forming an annular gap surrounding the discharge chamber, the interior of the lamp tube being divided by means of the insulating material into separate chambers insulated from one another within which the electrodes are disposed. Advantageously, the positioning of the electrodes is advantageously considerably improved as regards possible shading of the emitted light, also thereby avoiding any excessive heating of the outer wall.

In EP 0 661 110 B1 a method is disclosed for the oxidation of an object, wherein by irradiating an oxygen-containing fluid with vacuum ultraviolet radiation from a barrier discharge lamp (dielectrically hindered discharge) with encapsulated xenon gas, ozone and activated oxygen is produced by a photochemical reaction between the oxygen-containing liquid and the ultraviolet radiation; the object being treated is brought in contact with the ozone and activated oxygen and oxidized by intervention of vacuum ultraviolet radiation. According to the process the distance "d" of the passage of the ultraviolet radiation emitted by the barrier discharge lamp to the object is to be as short as possible and an oxygen partial pressure p (in kPa) is to be established in the area between the discharge lamp and the object according to a given algorithm.

The value given for d×p is less than 60.8, d being measured in centimeters and p in atmospheres. In this manner it is said that, in addition to an elevated oxidation rate, an improved cleaning effect is achieved by a shorter period of treatment.

It proves to be a problem that, in the state of the art, a uniform illumination of the irradiated surface is to be achieved while preserving a minimum distance between radiator and surface, and on the other hand a high radiation intensity can be sustained only at a comparatively short distance, i.e., even if an irregular radiation density is accepted.

Even if it possible to improve the uniformity of the radiation by using several radiators, a certain lack of uniformity nevertheless occurs on account of the radiator raster. Furthermore, if only a single radiator fails, the complete set of radiators has to be replaced in order to avoid irregularities due to differences in the aging processes of the radiators.

The invention sets for itself the task of setting out from the above-mentioned EP 0 510 503 A2 and applying uniformly distributed radiation of high intensity over the surface being treated, the actual radiation times being kept short by having as short a distance as possible between the radiator and the surface being treated, in order to use such radiation at low cost as an intermediate step in a production process already introduced. Furthermore, high-power radiators are to be used insofar as possible, according to the state of the art cited in the beginning.

The task is accomplished by the method, in that during the irradiation a translational and/or rotary relative movement is performed between the substrate and the ultraviolet radiator.

It proves to be especially advantageous that the intensity of a high-power radiator is so strong that it is sufficient in practice to move a single radiator, but in some cases two or more radiators, over a substrate at a comparatively slight distance without the need to increase the necessary irradiation time for one process step in an overall process.

Thus, a uniform illumination of the surface being radiated can be achieved in a simple manner.

Furthermore, it proves advantageous that the method of the invention is suitable (a) for the cleaning of substrate surfaces—as for example the removal of photoresists or aerosols—and for modifying the molecular surface structure by surface oxidation of the substrate with ozone and oxygen radicals under ultraviolet radiation (photons break up the surface structure), and (b) for coating (or build-up of layers) substrate surfaces by reactive fragments out of the gas phase (between radiator and substrate surface) which settle on the surface and thus build up the coating (the photons emitted no longer interfere with coating).

In a preferred embodiment of the process, molecules of oxygen, ammonia, chlorine, fluorine, hydrochloric acid, hydrofluoric acid, hydrogen, nitrous oxide and/or silane compounds are treated with ultraviolet radiation of a wavelength between 60 nm and 350 nm, to form the radicals, and it is possible to treat individual substances or mixtures of a plurality of substances.

Preferably, an excimer radiator with a wavelength of 172 nm (xenon radiator) is used, in which case its intensity is very much stronger in comparison to ordinary radiators, resulting in a comparatively brief time of treatment with the relative movement.

Preferably, with regard to the cleavage of oxygen molecules and the formation of reactive $O(^3P)$ and $O(^1D)$ fragments or ozone formation, the treatment is performed under atmospheric conditions and atmospheric pressure; it is also possible, however, to perform the process in a vacuum or reduced pressure, in which case the substances being used in forming the radical molecules are placed in the area between the ultraviolet radiator and the substrate surface.

In a preferred embodiment of the invention, the discharge lamp is moved relative to the substrate along a path perpendicular to the longitudinal axis of its tubular discharge chamber, i.e., the substrate can also be moved perpendicular to the longitudinal axis of a stationary tubular discharge chamber. In this case it proves to be advantageous that a rapid coverage of a large area of the substrate is possible with a high radiation intensity through a short distance between the ultraviolet radiator and the substrate surface.

In an additional advantageous embodiment the discharge lamp is moved relative to the substrate parallel to the longitudinal axis of its tubular discharge chamber. Such irradiation is practical especially for elongated substrates or for substrates in the form of running strip material with the discharge lamp kept stationary.

In another embodiment of the invention the discharge lamp is rotated on the longitudinal axis of its discharge chamber and moved relative to the substrate; this means that one end of the elongated discharge chamber is at least approximately at the center of the rotation, while the other end moves in a direction tangential to the center point of the rotation, or, in the case of a stationary discharge lamp the substrate is moved. It is thus advantageously possible to irradiate or otherwise treat individual sectors of a substrate or a wafer as substrate in a different way.

It is furthermore possible to make a discharge lamp to rotate over the substrate surface on a rotation point in the center of the elongated discharge chamber, i.e., the substrate also can rotate under an elongated and static tubular discharge lamp. The terms, "relative" and "above the substrate surface, thus signifies that either the discharge lamp or the substrate is moved in translation or rotation, while the position of the discharge lamp can be arranged above or below the substrate surface being irradiated.

In a first embodiment of an apparatus for treating surfaces of substrates of organic or inorganic materials by ultraviolet irradiation with a gas-filled, elongated discharge chamber whose walls are formed by a dielectric, which is provided on the side facing away from the discharge chamber with at least one electrode, the task is solved by the invention in that at least one ultraviolet radiator is disposed in an irradiation unit wherein the apparatus has at least one displacing means for a relative translational movement between the substrate and the ultraviolet radiator.

In a preferred embodiment of the apparatus, the motion of the displacing means is produced by a controllable driver.

When such a system of relative motion between substrate and ultraviolet radiator(s) is used, considerably fewer radiators are used in comparison to the large-area radiation units of the practice, so that during operation fewer radiators need to be replaced, which ultimately also reduces the operating cost.

The task is accomplished according to the invention for a second embodiment of an apparatus for treating surfaces of substrates of organic or inorganic materials by ultraviolet radiation from an ultraviolet radiator disposed at the given distance, with a gas-filled, elongated discharge chamber whose walls are formed by a dielectric, and which is provided with at least one electrode on the side facing away from the discharge chamber, in that at least one ultraviolet radiator is disposed in an irradiation unit wherein the apparatus has at least one rotatory element for a relative rotatory movement between substrate and ultraviolet radiator.

In a preferred configuration of the second embodiment of the apparatus the rotatory element is connected to a controllable drive for the production of the rotatory movement.

In the case of relative rotatory movement between discharge lamp and substrate, it proves to be advantageous that, with a single radiator, a uniform radiation is possible in a low-cost manner; furthermore, the substrate surface can be divided into sectors of different treatment with successive steps such as, for example, cleaning, surface structuring and coating, and layered coating.

The subject matter of the invention is further explained below in conjunction with FIGS. 1, 2, 3a and 3b.

BRIEF DESCRIPTION OF THE FIGURES

FIG. 3a is a schematic of a preferred apparatus according to the invention having a substrate in a rotary mounting, wherein the surface of the substrate is irradiated by a discharge lamp as ultraviolet radiator from a radiation unit; and FIG. 3b is a schematic of a longitudinal section through FIG. 3a, showing that the radiator is situated at the given distance above the substrate surface.

DETAILED DESCRIPTION OF THE INVENTION

Figure 1:
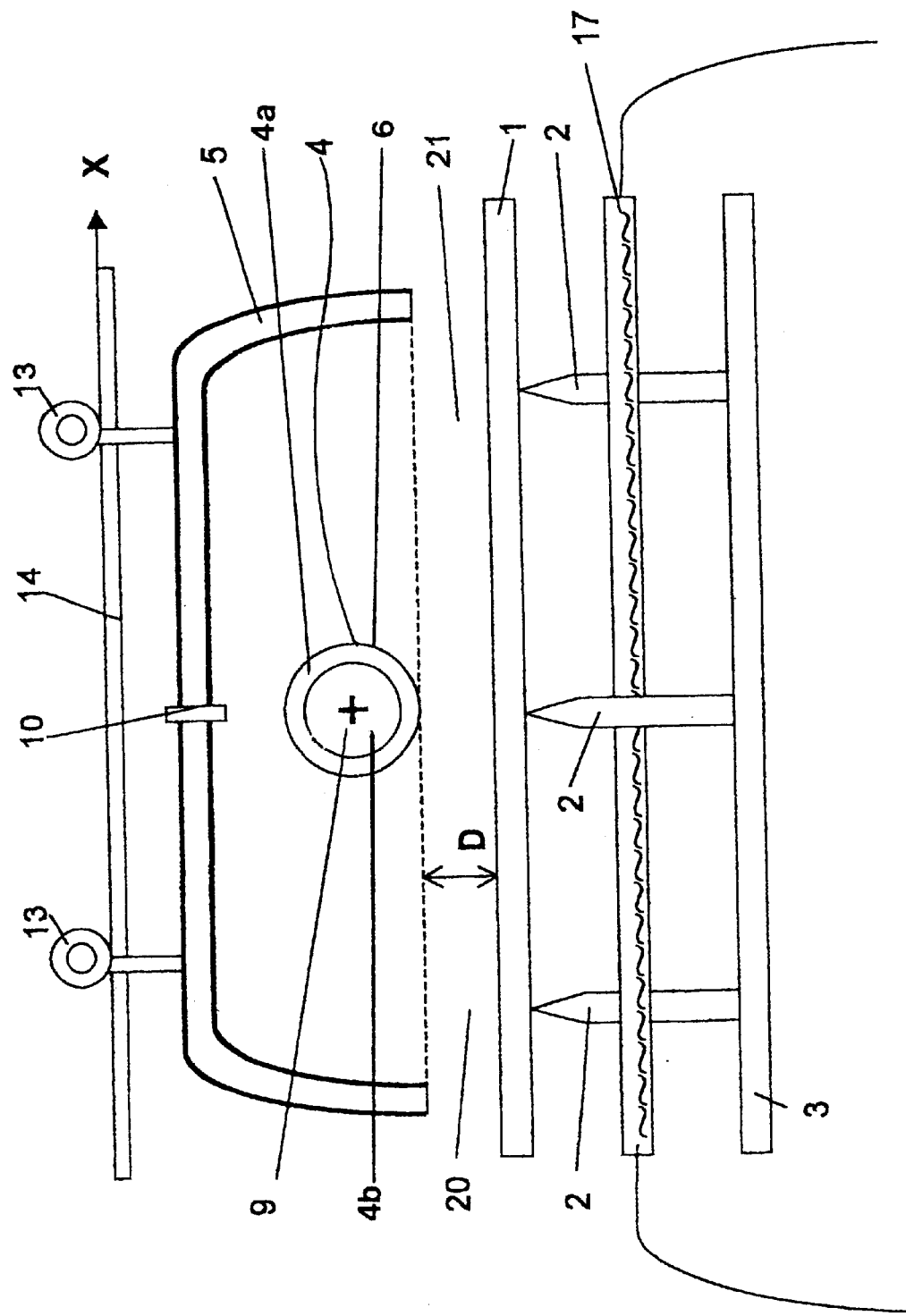
FIG. 1 is a schematic in longitudinal section (taken across the longitudinal axis of the ultraviolet radiator) a translationally driven radiation unit with an ultraviolet radiator disposed thereon, which is arranged at a given distance above a substrate contained in a stationary holder.

In FIG. 1 the substrate 1 is in a stationary mounting 3, being supported at a level by pins 2 which permit, for example, an optimal heating by infrared radiator 17 on the bottom of the substrate during the coating operation; such a mounting is disclosed, for example, in U.S. Pat. No. 4,687,544. If, however, no heating of the substrate is necessary, the substrate may also be arranged in a broad opening in a mounting, as described below in connection with FIG. 2.

Furthermore, in FIG. 1 the radiation unit 5 can be seen above the substrate 1 and has an ultraviolet radiator 4 which has a dielectric walls 4a and a discharge chamber 4b in its interior. Through at least one lateral opening 20,21, between the radiation unit 5 and the substrate 1, gas is delivered to form the reactive fragments, while the ultraviolet radiation acts on the gas in the area between ultraviolet radiator 4 and the substrate 1 as well as on the surface of the substrate 1. If atmospheric air is used as the gas to be irradiated, it can enter by natural convection; it is also possible, however, to deliver other gases through lateral nozzles. The radiation unit 5 is arranged for displacement on wheels 13 along a rail 14, the translational movement direction being represented by the arrow X; the translational movement of the radiation unit is produced both in direction X and in the opposite direction by a controllable motor, here not shown, preferably a linear motor. The longitudinal axis of the ultraviolet radiator 4 represented in cross section is identified by the number 9. Electrode 6 on the side of discharge wall 4a faces away from discharge chamber 4b.

To permit a very fast and complete treatment of the substrate, an elongated ultraviolet radiation source 4 is preferred, whose length corresponds at least to the minimum size of the substrate, as for the example the diameter of a round wafer as substrate. The distance between substrate 1 and ultraviolet radiator 4 is marked "D." It ranges from 1 to 10 mm if atmospheric conditions exist.

The actual reaction takes place in the area 7 between ultraviolet radiator 4 and substrate 1, while the radiation emitted by the radiator 4 is absorbed by the molecules being treated for the purpose of converting them, but on the other hand there is still enough intensity of radiation to achieve sufficient strength of radiation on the substrate 1 for the surface treatment.

Such an arrangement is suitable both for cleaning and for surface structuring as well as for coating the substrate surface.

On the other hand, if nitrogen or another inert gas that does not absorb ultraviolet radiation can be supplied through an inlet 10 situated above the radiator 4, it is possible due to the lower absorption to set a greater distance "D."

Also, distance D can also be increased under atmospheric conditions if radiation of the substrate surface with photons is no longer necessary, as is the case with the coating or layer coating of the substrate surface.

Figure 2:
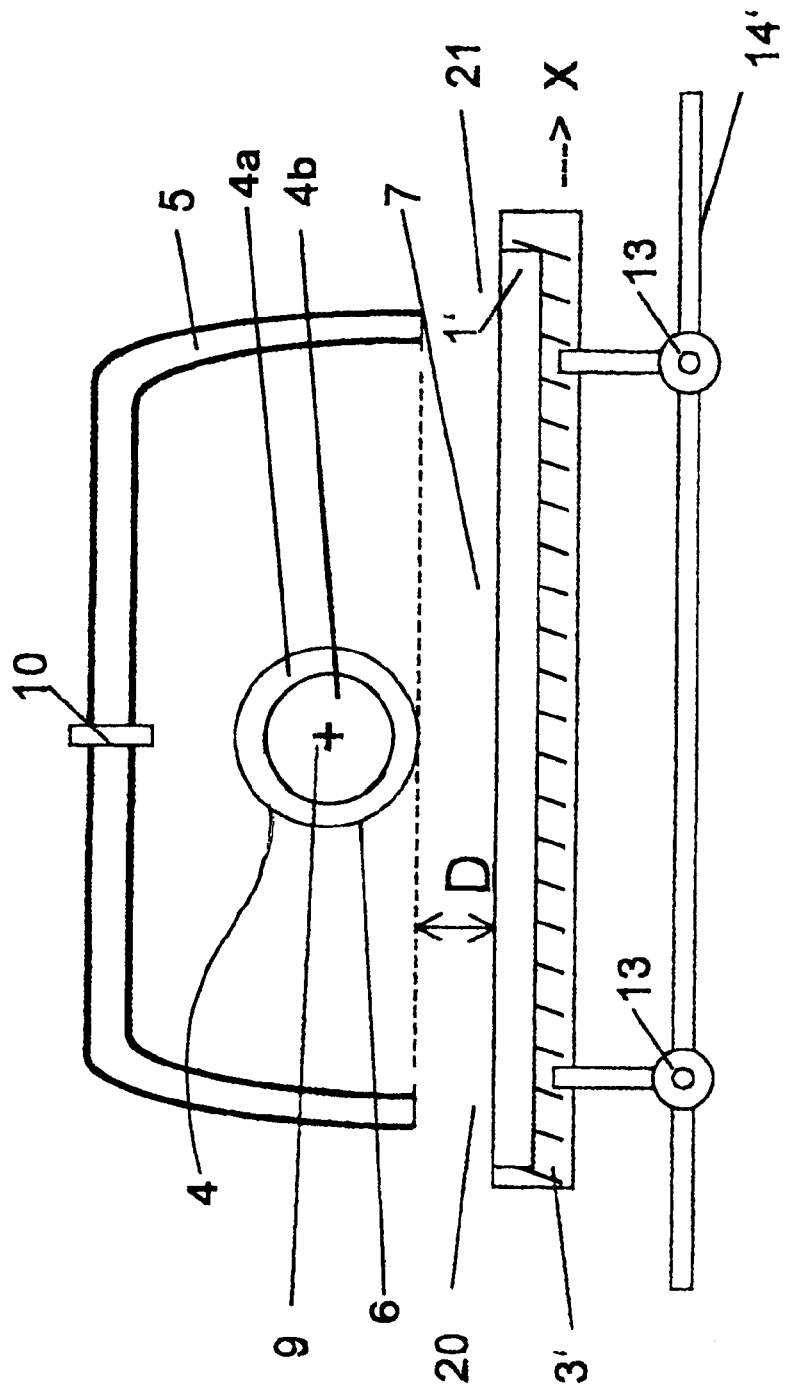
FIG. 2 is a schematic of a substrate disposed for translation with a stationary radiation unit in which a stationary ultraviolet radiator (in a section across the longitudinal axis of the ultraviolet radiator) is arranged.

FIG. 2 shows a similar basic construction as FIG. 1, but here the irradiation unit 5 with the ultraviolet radiator 4 serving as discharge lamp is stationary, while the substrate 1' is in a broad recess in a mounting 3'.

The mounting 3' is displaceable along a rail 14' on wheels, so that the substrate 1' can be irradiated over its entire length by moving along the X-axis of the ultraviolet radiator 4. To obtain a uniform exposure over the entire surface of the substrate 1', the mounting 3' is driven by a controllable drive means, here not shown, along the X axis. Here, again, the longitudinal axis of the ultraviolet radiator 4 shown in cross section is identified by the reference number 9.

In the case of elongated substrates or substrates in ribbon form which are moved along their greatest dimension parallel to the longitudinal axis of the tubular discharge chamber of the ultraviolet radiator, an apparatus similar to FIGS. 1 and 2 can be used; i.e., in such cases the longitudinal axis of the ultraviolet radiator runs parallel to direction X. Furthermore, it is possible for the movement of continuous ribbon material to move it by means of a revolving conveyor belt both in direction X and perpendicular to the longitudinal axis.

The delivery of the gas to be irradiated also is performed in a manner similar to that of the apparatus described in connection with FIG. 1.

According to FIG. 3a the substrate 1" is in a recess fitted to it for secure positioning in a mounting 3" of cylindrical configuration in its outer contour, which is mounted on bearing 22 for rotation about the axis marked Z.

The longitudinal axis 9 of the elongated ultraviolet radiator 4 as a discharge lamp in radiation unit 5 runs in a horizontal direction perpendicular to the rotation axis Z. According to FIG. 3b, the ultraviolet radiation represented symbolically by arrows 24 issues from the ultraviolet radiator 4 represented schematically in longitudinal section (taken along longitudinal axis 9), parallel (in the opposite direction) to the axis Z toward the surface of the substrate 1", the radiation being directed through the light exit opening 25 against a precisely defined sector of the substrate 1". The substrate 1" is set in rotation or in a step-wise rotation by a controllable motor, not shown. It has proven to be advantageous if, during the radiation of a sector of substrate 1" a sector not struck by the radiation can be worked in another manner, but it is also possible to use a second and perhaps third radiator in order to perform successively and in a simple manner the following process steps, such as cleaning, surface texturing and coating.

The delivery of gas is omitted from FIGS. 3a and 3b for easier comprehension; it is performed in a manner similar to the devices explained with the aid of FIGS. 1 and 2.

The mounting 3, 3', 3" consists preferably of a low-wear, corrosion resistant material sufficiently soft for comparatively thin or delicate substrates.

We claim:

1. An apparatus for treating a surface of a substrate made of inorganic or organic materials with ultraviolet radiation comprising:

an irradiation unit having an ultraviolet radiator disposed therein and positioned at a predetermined distance away from a substrate, said ultraviolet radiator having a gas-filled elongated discharge chamber whose walls are formed by a dielectric, which is provided on the side facing away from the discharge chamber with at least one electrode;

a displacing element for a translational movement of said irradiation unit relative to the substrate.

2. An apparatus for treating a surface of a substrate made of organic or inorganic materials with ultraviolet radiation comprising:

at least one ultraviolet radiator as a discharge lamp disposed at a distance away from the substrate, the discharge lamp having a gas-filled, elongated discharge chamber whose walls are formed by a dielectric, which is provided on the side facing away from the discharge chamber with at least one electrode;

wherein said at least one ultraviolet radiator is disposed in an irradiation unit, the apparatus having at least one rotational element for a rotational movement of said irradiation unit relative to the substrate.

* * * * *